United States Patent [19]

Ito et al.

[11] 4,306,205

[45] Dec. 15, 1981

[54] HIGH FREQUENCY APPARATUS

[75] Inventors: Katsuo Ito; Eiichi Hibino; Kiyoshi Kawakita, all of Kanazawa, Japan

[73] Assignee: Murata Manufacturing Co., Ltd., Japan

[21] Appl. No.: 87,933

[22] Filed: Oct. 25, 1979

[30] Foreign Application Priority Data

Oct. 31, 1978 [JP] Japan ............................ 53/149788[U]
May 22, 1979 [JP] Japan ............................ 54/69159[U]

[51] Int. Cl.³ .................................................. H04B 1/08
[52] U.S. Cl. ..................................... 334/85; 361/302; 361/415; 455/347
[58] Field of Search ................... 334/85, 89; 361/400, 361/409, 412, 415; 455/347

[56] References Cited

U.S. PATENT DOCUMENTS 3,147,402 9/1964 Hochstetler .................... 361/412 X
3,774,080 11/1973 Weidel ............................ 361/412 X

*Primary Examiner*—Paul L. Gensler
*Attorney, Agent, or Firm*—Ostrolenk, Faber, Gerb & Soffen

[57] ABSTRACT

A high frequency apparatus such as an electronic television tuner comprises a main base plate having a circuit pattern and components disposed on it. A shield casing encloses and supports the main base plate by encompassing it at its peripheral edge. The shield casing is open at one side corresponding to one edge of the main base plate and is preferably also open at the upper and lower surfaces of the casing. The opened side of the shield casing is provided with an auxiliary base plate having a shield conductive film on its outer surface. The main base plate has a plurality of first apertures and the auxiliary base plate has corresponding pluralities of second and third apertures. Capacitor elements are inserted through at least some of the second apertures. The first apertures and apertures in the capacitor elements receive corresponding end portions of L shaped connection terminals. One end of each of the connection terminals is electrically connected to the circuit pattern, while the other end of each terminal is electrically connected to the hollow portion electrode of each of the cylindrical capacitor elements. Each of the connection terminals preferably has an integral protrusion received in the third aperture, for positioning the connection terminal. The open top and bottom surfaces of the shield casing are covered with shield covers.

15 Claims, 22 Drawing Figures

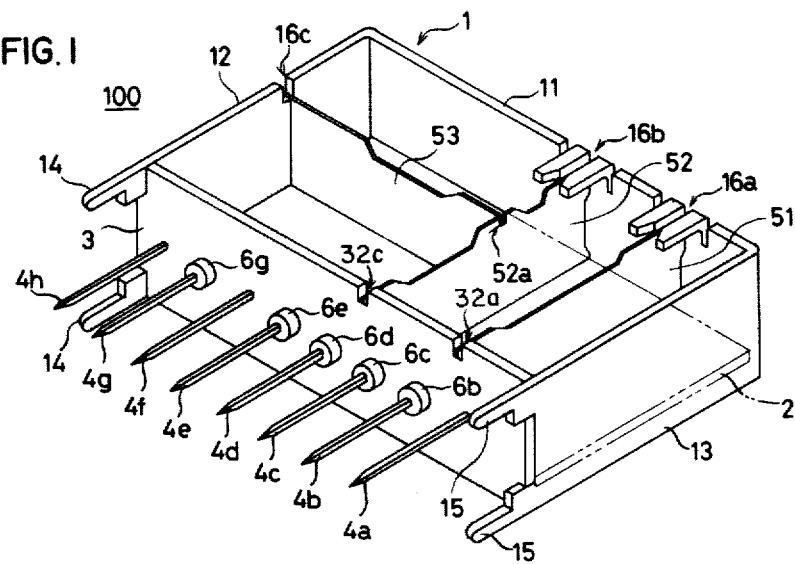
FIG. I
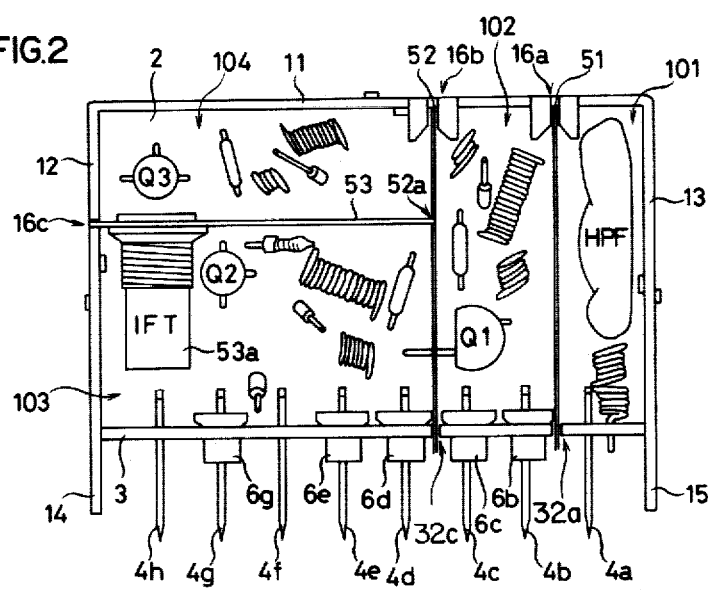
FIG. 2

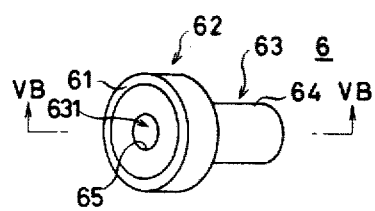
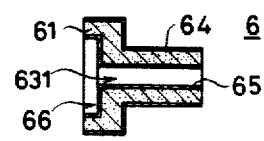
FIG.5A  FIG.5B
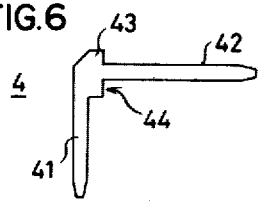
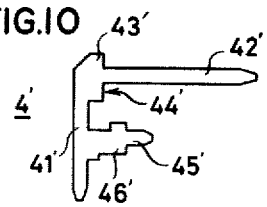
FIG.6  FIG.10
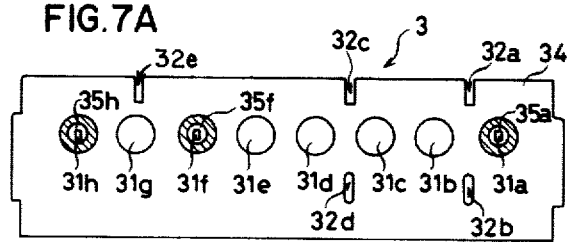
FIG.7A
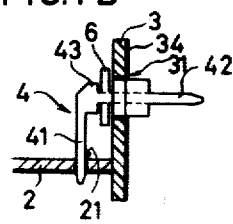
FIG.7B
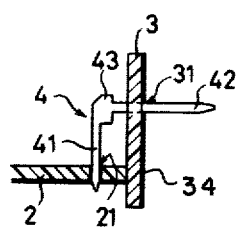
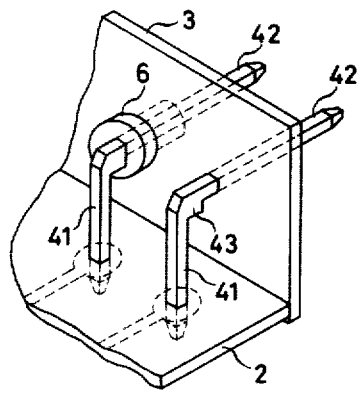
FIG.7C  FIG.7D

HIGH FREQUENCY APPARATUS

BACKGROUND OF THE INVENTION

1. Field of the Invention

The present invention relates to a high frequency apparatus. More specifically, the present invention relates to an improved structure of a high frequency apparatus having external connection terminals withdrawn through cylindrical capacitor elements. Such high frequency apparatus may be an electronic television tuner (VHF, UHF) or an FM tuner, CATV tuner or an RF modulator for use in VTR.

2. Description of the Prior Art

Of late, the so-called electronic tuners have been put into practical use in place of television tuners of a conventional rotary type mechanical structure. Generally, television tuners have been employing a shield casing and various bypassing capacitors for the purpose of preventing a spurious radiation from a local oscillator and for preventing an unfavorable influence by virtue of an external noise. It has been observed that by way of such a bypassing capacitor a feedthrough capacitor exhibits a better characteristic as compared with an ordinary disk type capacitor and hence a feedthrough capacitor achieves a better performance of a television tuner per se. Nevertheless, with a recent tendency to an electronic implementation of television tuners, miniaturization or compactness of such television tuners has been imperative. However, miniaturization of television tuners in accordance with such requirement of compact television tuners has made it extremely difficult to fix feedthrough capacitors to a television tuner. For this reason, it has been a common practice to employ disk type capacitors in a miniaturized television tuner in spite of a worse characteristic. Accordingly, such miniaturized electronic tuner does not necessarily exhibit good performance with respect to spurious radiation and the like by virtue of a difference of a type of bypassing capacitors employed therein. Therefore, it is strongly desired that feedthrough capacitors can be utilized as bypassing capacitors in a high frequency apparatus such as an electronic tuner, thereby to improve the performance.

SUMMARY OF THE INVENTION

In order to meet the above described requirements, the present invention provides an improved high frequency apparatus, which comprises a main base plate including a circuit pattern and a shield casing. The shield casing is opened at the side corresponding to at least one side of the main base plate and is also opened at least one of the upper and lower surfaces. The opened side of the shield casing is provided with an auxiliary base plate, which together with the shield casing encompasses the main base plate. In order to afford a shield effect to the auxiliary base plate, the auxiliary base plate is formed with a conductive layer on substantially the whole one main surface. The main base plate is formed with first apertures, while the auxiliary base plate is formed with second apertures at the positions associated with the first apertures. Cylindrical capacitor elements are inserted through the second apertures of the auxiliary base plate to form feedthrough capacitors. External connection terminals are provided such that one end of each of them is inserted into the corresponding first aperture of the main base plate and the other end is inserted into a hollow portion of the corresponding cylindrical capacitor element. One end of each of the external connection terminals is electrically connected to the circuit pattern and is mechanically fixed. The other end of each of the external connection terminals is electrically connected to an electrode of the corresponding cylindrical capacitor element and is mechanically fixed. Accordingly, each of the external connection terminals has been bent such that one end and the other end cross at substantially the right angle. A shield cover is provided to cover the upper and lower openings of the shield casing.

According to the present invention, since the feedthrough capacitors can be employed as bypassing capacitors in a high frequency apparatus, a high frequency apparatus of an improved characteristic can be provided. According to the present invention, tiresome work conventionally required in incorporating feedthrough capacitors in such a miniaturized high frequency apparatus can be eliminated and accordingly a miniaturized high frequency apparatus can be fabricated with extreme ease.

According to a preferred embodiment of the present invention, the auxiliary base plate is formed with third apertures in the vicinity of and corresponding to the second apertures. On the other hand, each of the external connection terminals is formed with a protrusion extending in parallel with the other end thereof, so that the protrusion is fitted into the corresponding third aperture and hence the connection terminal can be tentatively fixed and ultimately positioned. With such a structure, even in assembling such a high frequency apparatus wherein external connection terminals are used as the feedthrough conductors of feedthrough capacitors, the feedthrough capacitors can be tentatively fixed, which very much facilitates assembling work.

Accordingly, a principal object of the present invention is to provide an improved high frequency apparatus.

Another object of the present invention is to provide an improved high frequency apparatus which is miniaturized and achieves better performance.

A further object of the present invention is to provide a miniaturized high frequency apparatus which is easy of assemblage.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view of a VHF television tuner of one embodiment of the present invention;

FIG. 2 is a plan view of the FIG. 1 embodiment;

FIGS. 5A and 5B are a perspective view and a sectional view, taken along the line VB—VB in FIG. 5A, respectively, of one example of a cylindrical capacitor element constituting a feedthrough capacitor;

FIG. 6 is an illustration of one example of an external connection terminal for use in the embodiment shown;

FIGS. 7A to 7D are views for explaining a connection manner of the external connection terminals, wherein FIG. 7A shows an auxiliary base plate, FIG. 7B shows a connection of the connection terminal through a cylindrical capacitor element, FIG. 7C shows a connection manner of the external connection terminal in the absence of a cylindrical capacitor element, and FIG. 7D shows a rear perspective view of the external connection terminals, as assembled;

FIGS. 9A to 9E show an appearance of a VHF television tuner of one embodiment of the present invention, wherein FIG. 9A is a front view of the same, FIG. 9B is a plan view of the same, FIG. 9C is a right side view of the same, FIG. 9D is a left side view of the same, and FIG. 9E is a rear view of the same;

FIG. 10 is a view showing one example of an external connection terminal for use in another embodiment of the present invention; and FIGS. 11A to 11D show another embodiment of the present invention, wherein FIG. 11A is a view of another embodiment of an auxiliary base plate, FIG. 11B is a view showing a connection manner of the outer connection terminal, as assembled, through a cylindrical capacitor element, FIG. 11C is a view showing a connection manner of the external connection terminal, as assembled, in the absence of a cylindrical capacitor element, and FIG. 11D is a rear perspective view of the external connection terminals, as assembled.

DESCRIPTION OF THE PREFERRED EMBODIMENTS

Figure 3:
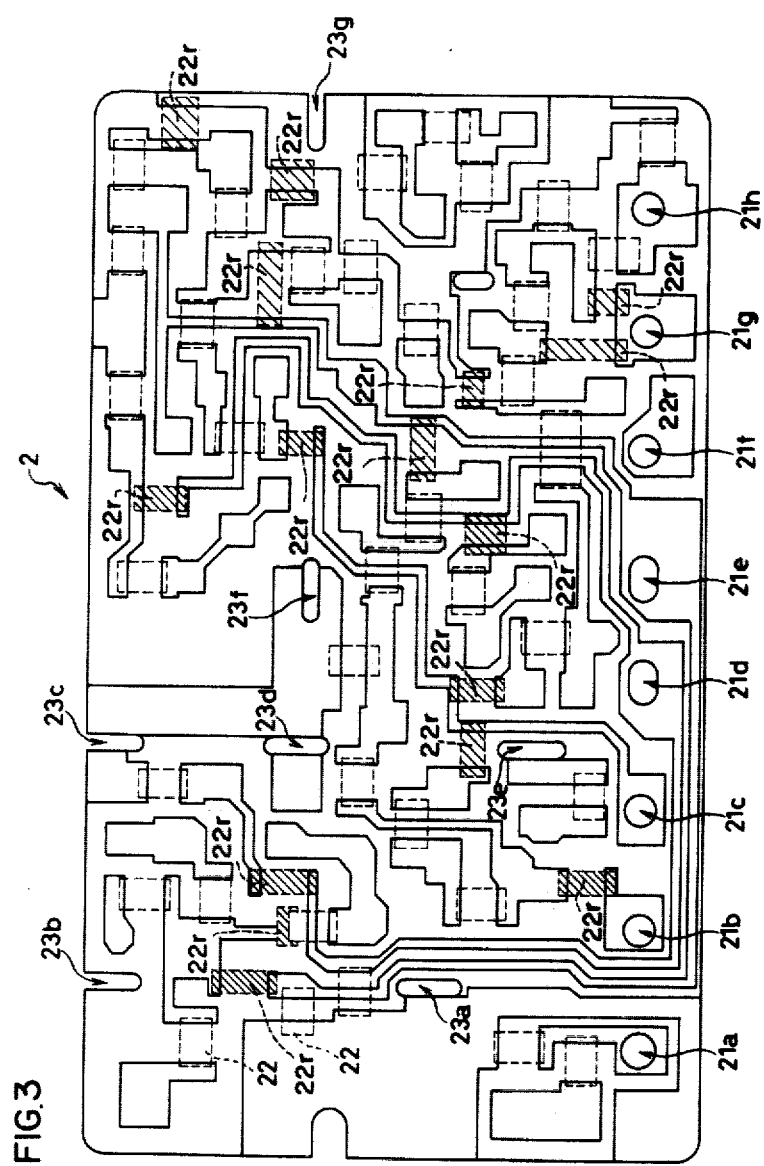
FIG. 3 is an illustration of an example of a circuit pattern of a main base plate and an arrangement of those components mounted to the rear surface of the main base plate for use in the embodiment shown.

FIG. 1 is a perspective view showing one example of a VHF television tuner in accordance with the present invention. FIG. 2 is a plan view of such an electronic tuner. The electronic tuner 100 comprises a frame 1 serving as a shield casing, a circuit base plate 2 serving as a main base plate, an auxiliary base plate 3 having a shield function and for connecting and fixing external connection terminals, external connection terminals 4, shield plates 51 to 53, and cylindrical capacitor elements 6 as major components thereof. The cylindrical capacitor elements 6 may comprise the so-called feedthrough capacitors including external connection terminals as feedthrough conductors, respectively.

The frame 1 is made of a plate of conductive material such as iron, which comprises an elongated flat plate portion 11 extending in the vertical direction, and side plate portions 12 and 13 extending in parallel with each other and crossing the above described flat plate portion 11 at substantially the right angle at both ends thereof. The free end of the side plate portion 12 is formed with a pin 14 for fixing the tuner to a base plate, not shown, and the free end of the side plate portion 13 is formed with a similar pin 15 for the same purpose. The flat plate portion 11 of the frame 1 is further formed with shield plate retaining portions 16a and 16b for retaining one end of each of shield plates 51 and 52. The side plate portion 12 is formed with a shield plate retaining portion 16c for retaining one end of a shield plate 53. The auxiliary base plate 3 is fixed at the free ends of the frame 1 i.e. the free ends of the side plate portions 12 and 13.

Figure 11A:
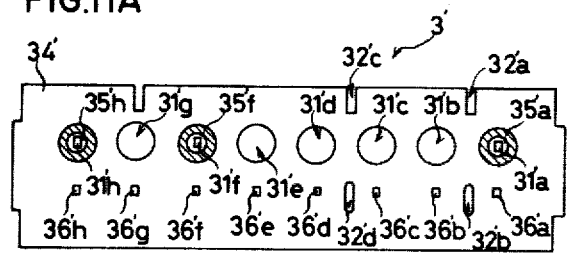

The above described auxiliary base plate 3 is covered with a copper foil on the whole one surface thereof, as to be depicted in FIGS. 7A and 11A, whereby a shield effect is performed. The auxiliary base plate 3 is formed with shield plate retaining portions 32a and 32c each corresponding to the above described shield plate retaining portions 16a and 16b, respectively. The end portions of the auxiliary base plate 3 are coupled and fixed to the free ends of the side plate portions 12 and 13. The circuit base plate 2 is formed of a print pattern as shown in FIG. 3 and is further provided with passive element chips such as a plurality of capacitors 22 serving as circuit components being connected to the print pattern such that these are electrically connected to predetermined portions of the print pattern and mechanically fixed to the circuit base plate 2. Referring to FIG. 3, the hatched portions 22r show those where a resistor film is formed to serve as passive elements, wherein the resistor film is disposed between prescribed portions of the print pattern in electrical contact therewith. The circuit base plate 2 is formed with first apertures 21a to 21h for insertion of external connection terminals 4a to 4h and for electrical and mechanical connection of these external connection terminals 4a to 4h to the circuit base plate 2. It is pointed out that those apertures 21a to 21h are formed at the portions in association with the print pattern where the above described external connection terminals 4a to 4h are to be connected. It is further pointed out that FIG. 3 is a rear view of the circuit base plate 2. FIG. 3 does not particularly illustrate those apertures for mounting such active and passive elements as shown in FIG. 2, however. Referring to FIG. 3, apertures or notches 23a to 23g are aimed to receive, electrically connect and fix the legs of the shield plates 51 to 53 shown in FIG. 1, wherein those 23a and 23b are allotted to the shield plate 51, those 23c, 23d and 23e are allotted to the shield plate 52 and those 23f and 23g are allotted to the shield plate 53.

Figure 4:
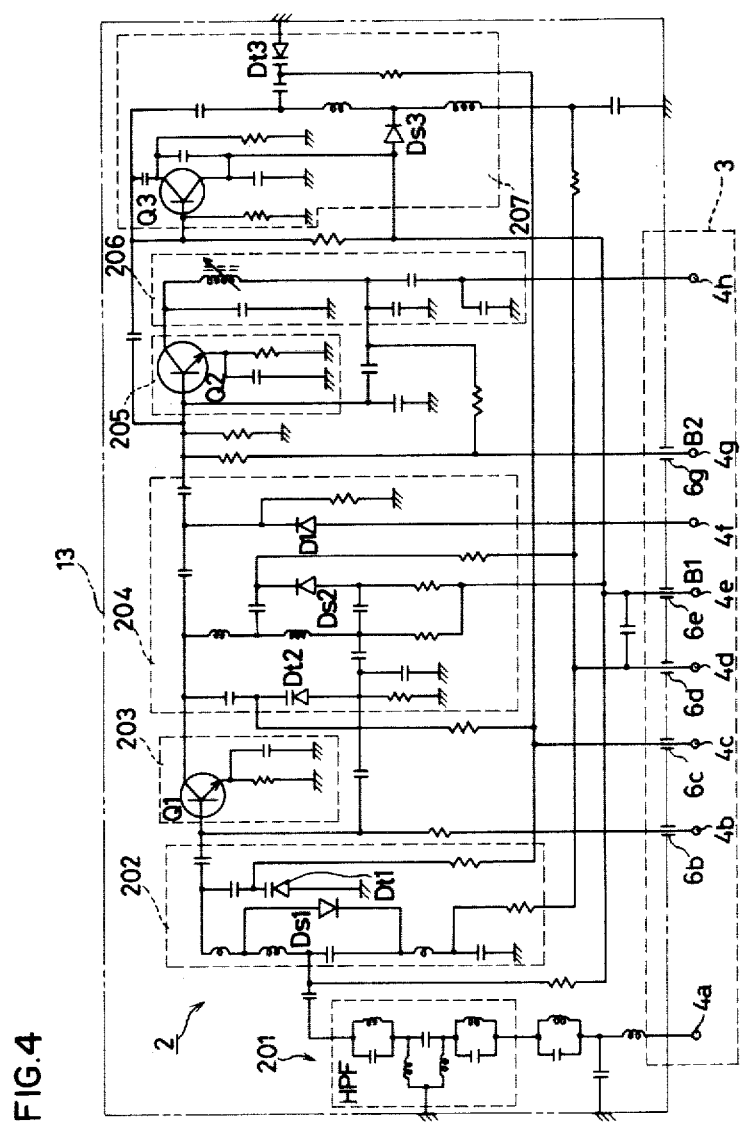
FIG. 4 is a schematic diagram of the embodiment shown.

FIG. 4 is a schematic diagram of the electronic tuner of the embodiment shown in FIGS. 1 and 2. Referring to FIG. 4, the reference numeral 201 denotes an input tuning stage including a high pass filter HPF, the reference numeral 202 denotes a preselector stage, the reference numeral 203 denotes an RF amplifying stage, the reference numeral 204 denotes a band pass selector stage, the reference numeral 205 denotes a mixer stage, the reference numeral 206 denotes an IF first stage, and the reference numeral 207 denotes a local oscillator stage. The external connection terminals 4a to 4h shown in FIGS. 1 and 2 are connected to the corresponding components in the manner as shown in FIG. 4. As better seen from FIG. 4, the cylindrical capacitor elements 6b, 6c, 6d, 6e and 6g each have the external connection terminals 4b 4c, 4d 4e and 4g, respectively, inserted through the respective hollow portions thereof. The external connection terminal 4a is inserted through the aperture 21a shown in FIG. 3 and is electrically connected to the portion of the print pattern associated with the aperture 21a and is also mechanically fixed. Similarly, the external connection terminals 4b to 4h are inserted to the corresponding apertures 21b to 21h, respectively, so that these are electrically connected to the corresponding portions of the print pattern and are mechanically fixed. The shield plates 51, 52 and 53 are provided to electrically shield the respective circuit stages of the electronic tuner 100 from each other. The shield plate 51 is retained at both ends thereof by the above described shield plate retaining portions 16a and 31a. The shield plate 52 has a shield plate retaining portion 52a corresponding to the above described shield plate retaining portion 16c and is retained at both ends by the above described shield plate retaining portions 16b and 31b. The shield plate 53 is provided with an intermediate frequency transformer 53a and is retained at both ends by the above described shield plate retaining portions 16c and 52a.

The shield casing or frame 1 thus structured includes compartments 101, 102, 103 and 104. The compartment 101 shown in FIG. 2 is allotted to accommodate the circuit components of the input tuning stage 201 shown in the FIG. 4 schematic diagram such as the high pass filter HPF. The compartment 102 is allotted to accommodate the circuit components of the preselector stage 202 and the RF amplifying stage 203 shown in the FIG. 4 schematic diagram, such as a transistor Q1 and so on. The compartment 103 is allotted to accommodate the circuit components of the band pass selector stage 204, the mixer stage 205 and the intermediate frequency first stage 206 shown in the FIG. 4 schematic diagram such as the transistor Q2 and an intermediate frequency transformer. The intermediate frequency transformer 53a is mounted to the shield plate 53, as described previously. The compartment 104 is allotted to accommodate those components of the local oscillator stage 207 shown in the FIG. 4 schematic diagram, such as a transistor Q3 and so on.

The external connection terminal 4a is connected to the center conductor of an 75Ω coaxial cable, not shown, for example to supply a television signal to the tuner circuit. The external connection terminal 4b is allotted to supply an automatic gain control voltage and is connected to receive an automatic gain control voltage obtainable from a video intermediate frequency circuit, for example. The external connection terminal 4c is allotted to receive a stepwise variable tuning voltage for channel selection. Such a stepwise variable tuning voltage is received from a channel selector, not shown, as well known to those skilled in the art. The tuning voltage applied to the connection terminal 4c is applied to variable capacitance diodes Dt1, Dt2, and Dt3. The external connection terminal 4d is alloted to receive a band switching voltage obtainable from a channel selector, not shown, and is coupled to switching diodes Ds1, Ds2 and Ds3. In case of selecting a low band channel, a reverse biasing voltage is applied to the switching diodes Ds1 and Ds2, thereby to cut off the same. On the other hand, in selecting a high band channel, the terminal 4d is connected to the ground, whereby these diodes Ds1 to Ds3 are rendered conductive. The external connection terminals 4e and 4g are allotted to receive source voltages for the purpose of energization. More specifically, the external connection terminal 4e is allotted to receive a source voltage B1 to supply the same to those circuit stages other than the mixer stage 205 and the external connection terminal 4g is allotted to receive a source voltage B2 to supply the same only to the mixer stage 205. These external connection terminals 4e and 4g are connected to receive the different source voltages, because if and when an intermediate frequency signal of UHF applied to the external connection terminal 4f is available, i.e. the UHF band is selected, it is adapted such that the external connection terminal 4e and thus those circuit stages other than the mixer stage 205 are not supplied with the source voltage B1, thereby to avoid undesired waste of power consumption by those circuit stages in such a situation. The intermediate frequency signal of UHF is applied to the external connection terminal 4f and the diode D1 is cut off or rendered conductive responsive to the above described signal, whereby the intermediate frequency signal is applied to the mixer stage 205. The external connection terminal 4g is connected to the intermediate frequency first stage 206, so that the intermediate frequency signal is obtained therefrom.

An example of specific dimensions of the electronic tuner 100 shown in FIGS. 1 and 2 will be described. In one example, the width of the electronic tuner 100, i.e. the length of the flat plate portion 11 is about 46 mm, the lengths of the side plate portions 12 and 13, including the pins 14 and 15, respectively, are about 33 mm, and the height, i.e. the width of the shield case 1 is about 13 mm. On the other hand, the print base plate 2 is about 43 mm in length and about 25 mm in width. The intervals between the respective apertures 21a to 21h of the circuit base plate 2 are each about 5 mm. The length of the auxiliary base plate 3 shown in FIG. 7A is about 45 mm and the width thereof is about 13 mm. The intervals of the second apertures 31a to 31h are each about 5 mm. As better seen from the above described specific example of dimensions, the inventive electronic television tuner is very compact as compared with conventional ones. Accordingly, it is extremely difficult to assemble such a miniaturized television tuner by employing the feedthrough capacitors as bypassing capacitors, unless the present invention is practiced. For example, one might think of connecting and fixing first the feedthrough capacitors to the auxiliary base plate 3 and then connecting the circuit base plate 2 and the feedthrough conductors of the feed through capacitors by means of jumper wires; however, it would be readily appreciated that is is extremely difficult to solder such jumper wires to an extremely narrow space in such a miniaturized television tuner. Furthermore, without the present invention, employment of completed feedthrough capacitors requires a duplication of work, such as the step of first completing feedthrough capacitors, and the step of assembling thus completed feedthrough capacitors into a tuner. Furthermore, without the present invention, it is necessary to draw external connection terminals while insulating the same from the shield casing, if and when it is desired that such external connection terminals are drawn without extending through feedthrough capacitors, which makes the assemblage work complicated. Thus, it was hardly possible to employ feedthrough capacitors as bypassing capacitors in such a conventional miniaturized electronic tuner. It is pointed out that the present invention was made in the light of the above described problems encountered in a conventional electronic tuner.

FIG. 5A is a perspective view of one example of a cylindrical capacitor element 6 for use in the present invention and FIG. 5B is a sectional view taken along the line VB—VB in FIG. 5A. The cylindrical capacitor element 6 is made of a dielectric material 61 such as ceramic and comprises a cylindrical portion 63 having a flange portion 62 formed at the end of the same. As better seen in FIG. 5B, the flange portion 62 is formed with a recess 66, whereby the distance between electrodes 64 and 65 has been made as small as possible. The electrodes 64 and 65 are formed on the outer and inner surfaces, respectively, of the flange portion 62 and the cylindrical portion 63, with both electrodes electrically isolated from each other. In forming such cylindrical capacitor element 6, first a dielectric unit 61 including the flange portion 62 and the cylindrical portion 63 is fabricated. Then the unit 61 is immersed in a plating bath, so that the electrode film is formed on the whole surface of the unit 61. Thereafter, the end surface of the flange portion 62 and the end surface of the cylindrical portion 63 are removed by means of a grinder, for example, so that two electrodes 64 and 65 are electrically isolated from each other. The other end of a corresponding external connection terminal 4 is inserted into the hollow portion 631 of the cylindrical portion 63 and is electrically connected to the electrode 65.

FIG. 6 is a view showing one example of an external connection terminal for use in the present invention. The external connection terminal 4 is formed substantially in an L letter shape, thereby to comprise two portions or arms 41 and 42 crossing each other at substantially the right angle. The tip end of the arm 41 is inserted into the apertures 21a to 21h shown in FIG. 3 as one end of the external connection terminal 4 and the other arm 42 is inserted into the hollow portion 631 of the cylindrical capacitor element 6 (FIG. 5B). The arm 42 is formed with a large width portion 43, so that the end edge 44 of the large width portion 43 abuts against the end surface of the recess 66 of the cylindrical capacitor element 6 (FIG. 5B), thereby to urge the cylindrical capacitor element 6 toward the auxiliary base plate 3.

FIG. 7A is a view showing one example of the auxiliary base plate 3. The auxiliary base plate 3 is covered with the conductive foil 34, excluding the hatched portion shown in FIG. 7A. The auxiliary base plate 3 is formed with the apertures 31a, 31f and 31h for the external connection terminals 4a, 4f and 4h, respectively, and apertures 31b, 31c, 31d, 31e and 31g for the cylindrical capacitor elements 6b, 6c, 6d, 6e and 6g, respectively. The auxiliary base plate 3 is further formed with notches or apertures 32a, 32b, 32c, 32d and 32e. The notches or apertures 32a and 32b are allotted for connection and fixing of the shield plate 51 and the notches or apertures 32c and 32d are allotted for connection and fixing of the shield plate 52. Using the above described auxiliary base plate 3, one side 42 of the external connection terminal shown in FIG. 6 is connected and fixed as shown in FIGS. 1 and 2.

The auxiliary base plate 3 and the previously described main base plate 2 are coupled by means of the connection terminal 4 as shown in FIG. 6. FIG. 7B shows a sectional view of the connection terminal 4, as assembled, through the cylindrical capacitor element 6 and FIG. 7C shows a sectional view of the connection terminal 4, as assembled, in the absence of the cylindrical capacitor element 6. FIG. 7D is a fragmentary rear perspective view showing the connection manner of the connection terminals 4, as assembled. As better seen in FIGS. 7B, 7C and 7D, one side 41 of the external connection terminal 4 is inserted through the aperture 21 of the main base plate 2 and is electrically connected to the corresponding portion of the print pattern. At the same time, the other arm 42 of the external connection terminal 4 is inserted through the hollow portion of the cylindrical capacitor element 6 to extend outward of the auxiliary base plate 3. In such a situation the electrode 64 (FIG. 5B) of the cylindrical capacitor element 6 is electrically connected and fixed to the conductive foil 34 of the auxiliary base plate 3. One portion 42 of the external connection terminal 4 is electrically connected and fixed to the electrode 65 of the cylindrical capacitor element 6. The conductive foil 34 of the auxiliary base plate 3 as well as the shield casing 1 is connected to the ground of for example a chassis (not shown). Accordingly, the external connection terminal 4 is coupled to the ground through the electrostatic capacitance of the cylindrical capacitor element 6.

As shown in FIG. 7C, in the absence of the cylindrical capacitor element, one portion 42 of the external connection terminal 4 is mechanically fixed by means of the conductive foil portion 35a, 35f or 35h, as shown in FIG. 7A.

Figure 8:
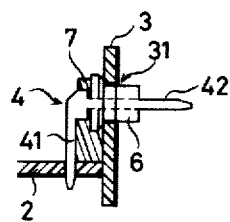
FIG. 8 is a view showing another example of a connection manner using the L letter shaped external connection terminal shown in FIG. 6.

FIG. 8 is similar to FIG. 7B but shows a sectional view of the external connection terminal, as assembled, using an insulation 7. In case of the FIG. 8 embodiment, the external connection terminal 4 is positioned with respect to the cylindrical capacitor element 6 by means of the insulation 7. Thus, it would be appreciated that the external connection terminal may be positioned using a separate auxiliary expedient, when the same is fixed.

Figure 9:
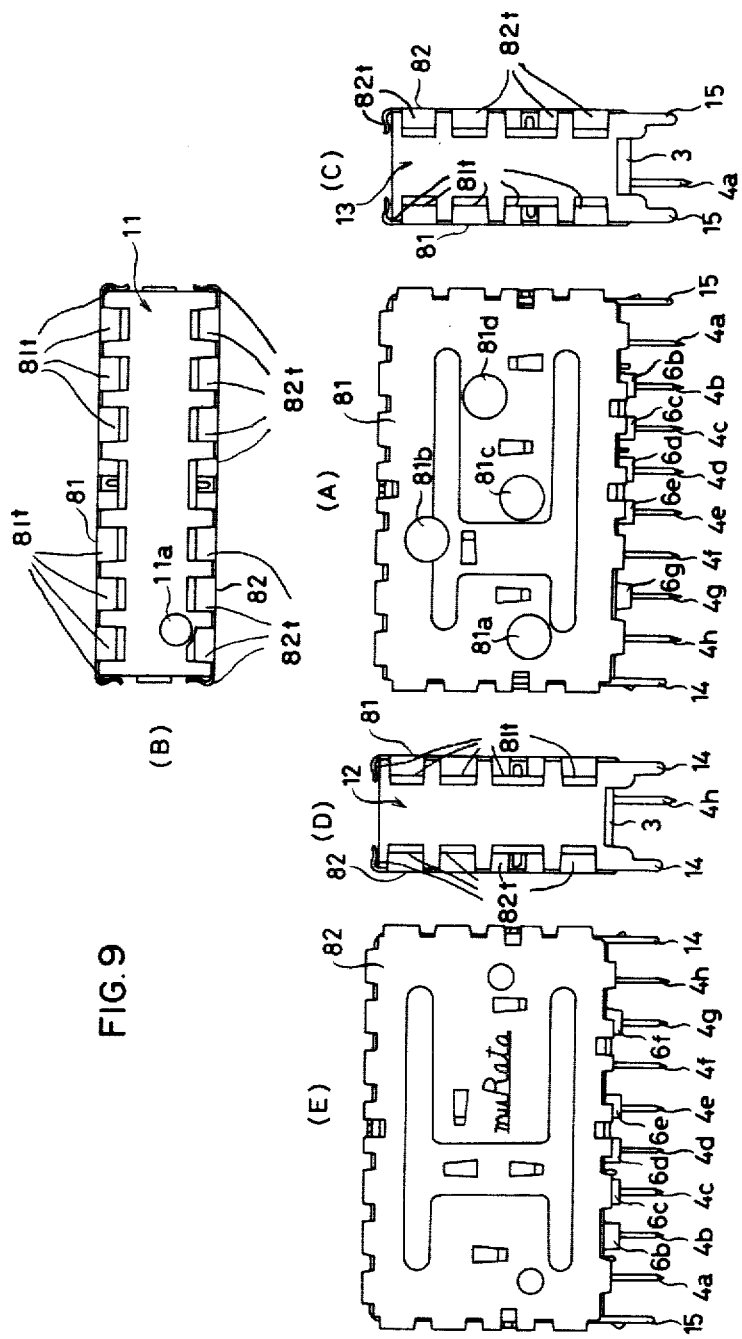

Assemblage of the external connection terminals 4 as well as the cylindrical capacitor element 6 between the main base plate 2 and the auxiliary base plate 3 may be performed in the following procedure. First, chip-like passive elements such as capacitor chips 22 are tentatively positioned at the respective prescribed positions on the circuit base plate 2, as shown in FIG. 3. It is pointed out that the circuit base plate 2 in such situation has been assembled to include various circuit components as shown in FIG. 2, so that a schematic diagram as shown in FIG. 4 has been completed. The main base plate 2 thus structured and circuited is inserted from the open side of the shield casing 1, as shown in FIG. 1. At that time, the shield casing 1 and the main base plate 2 are positioned with respect to each other by means of a suitable expedient. On the other hand, the cylindrical capacitor elements 6 are inserted into the apertures 31b, 31c, 31d, 31e and 31g of the auxiliary base plate 3 shown in FIG. 7A to a state as shown in FIG. 2. Then one side 42 of each of the L letter shaped external connection terminals 4 as shown in FIG. 6 is inserted into the corresponding one of the hollow portions 631 of the cylindrical capacitor elements 6 (FIG. 5) and the apertures 31a, 31f and 31h of the auxiliary base plate 3. The insulations 7 (FIG. 8) may be used as necessary. The auxiliary base plate 3 to which the elements 6 and one portion of each of the external connection terminal 4 are inserted is then fitted into the opened side of the shield casing 1 (FIG. 1). At that time, one arm 41 of each of the external connection terminals 4 is inserted into the corresponding one of the apertures 21a to 21h shown in FIG. 3. Then the rear surface of the main base plate 2, i.e. the print pattern surface of the main base plate 2 is solder dipped, thereby to connect and fix thus tentatively retained chip elements 22 to the corresponding portions of the print pattern and also to connect and fix one portion 41 of each of the external connection terminals 4 inserted into the corresponding one of the apertures 21a to 21h to the corresponding portion of the print pattern. Thereafter, the outer surface of the auxiliary base plate 3, i.e. the surface of the conductive foil 34 is solder dipped. Accordingly, one arm 42 of each of the external connection terminals 4 is connected and fixed to the electrode 65 of a corresponding one of the cylindrical capacitor elements 6 or to a corresponding conductive foil 35, and the electrode 64 of each of the cylindrical capacitor elements 6 is connected and fixed to the conductive foil 34. Finally, the shield covers 81 and 82 as shown in FIG. 9 are fitted in place, thereby to finish an assemblage of the inventive VHF electronic tuner.

FIGS. 9A to 9E show an appearance of a VHF television turner in accordance with the present invention, wherein FIG. 9A shows a front view, FIG. 9B shows a plane view, FIG. 9C shows a right side view, FIG. 9D shows a left side view, and FIG. 9E shows a rear view. As seen from FIGS. 9A to 9E, the openings of the shield casing 1 as shown in FIG. 1 are covered with the shield covers 81 and 82. The shield covers 81 and 82 can be naturally dispensed with, in case where only one side of the shield casing 1 is to be opened. Referring to FIG. 9B, the aperture 11A formed on the flat plate portion 11 of the shield casing 1 is allotted to align the tuning frequency of the intermediate frequency transformer. On the other hand, the apertures 81a to 81d formed on the shield cover 81 are allotted to align from outside the corresponding inductance elements, i.e. coils shown in FIG. 2. The side end portion of the shield covers 81 and 82 are bent at substantially the right angle to provide elastic portions or tongues 81t and 82t, so that elasticity thereof may be used in fitting the shield covers to the shield casing 1.

FIG. 10 is a view showing another embodiment of the external connection terminal for use in the present invention. In comparison thereof with the FIG. 6 embodiment, the FIG. 10 embodiment is characterized by formation of a protrusion 45'. The protrusion 45' is effectively utilized for positioning and tentatively fixing the external connection terminals 4' in connecting and fixing the same to the auxiliary base plate 3. Thus, the FIG. 10 embodiment is characterized by configuration of the external connection terminal substantially in the letter F shape. The protrusion 45' is inserted into the corresponding one of the third apertures 36a' to 36h' formed on the auxiliary base plate 3' shown in FIG. 11A. Preferably, the tip end of the protrusion 45' is selected to be of a contour which allows for pressure insertion into the third aperture 36'. Pressure insertion of the protrusion 45' into the aperture 36' of the auxiliary base plate 3' achieves tentative fixing on the occasion of assemblage of the auxiliary base plate 3', external connection terminals 4' and the cylindrical capacitor elements 6. Furthermore, the protrusion 45' is formed with a second protrusion or flange 46' so that the second protrusion 46' abuts against the auxiliary base plate 31 around the corresponding aperture 36', thereby to advantageously perform a positioning function in cooperation with the protrusion 45'.

Figure 11B:
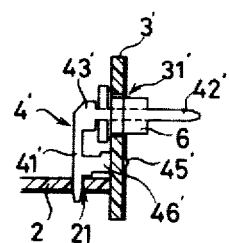
Figure 11C:
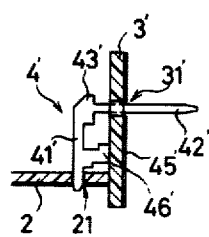
Figure 11D:
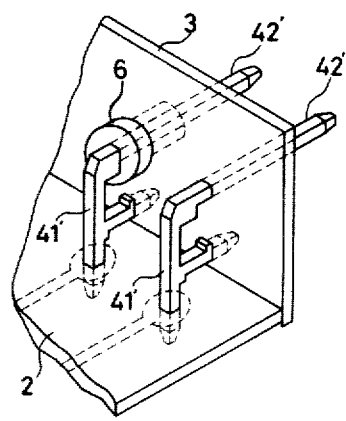

FIG. 11B is a view showing one example of the external connection terminal 4' as shown in FIG. 10, as assembled, through the cylindrical capacitor element 6. FIG. 11C is a view showing an assembled state of the external connection terminal 4' shown in FIG. 10, in the absence of the cylindrical capacitor element 6. FIG. 11D is a partial rear perspective view showing the external connection terminals 4', as assembled. In implementing a VHF electronic tuner using the F letter shaped external connection terminals 4' shown in FIG. 10, an assemblage can be made in substantially the same procedure as described previously in conjunction with the L letter shaped external connection terminals shown in FIG. 6. Meanwhile, if and when the F letter shaped external connection terminals as shown in FIG. 10 are employed, improper orientation of the cylindrical capacitor elements 6 can be effectively prevented in assembling the auxiliary base plate 3 as a function of the protrusion 45', while accurate positioning can be achieved. Therefore, insulation spacers 7 (FIG. 8) can be dispensed with.

Although in the foregoing a VHF television tuner as shown in FIG. 4 was described by way of an example, it should be pointed out that the present invention can be equally applied to any other types of UHF tuners, FM tuner, CATV tuner or an RF modulator for use in VTR, and the like. In the case where the present invention is employed in a UHF television tuner, a circuit configuration would be different as a matter of course. It is further pointed out that in case of UHF tuners the number of external connection terminals may be decreased by say three as compared with VHF tuners. More specifically, in case of UHF tuners only one terminal for supplying a source voltage is required and the external connection terminals 4d (the terminal for a band selection voltage) and 4h (the terminal for the intermediate frequency signal output) of the VHF tuner are not required.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high frequency apparatus, comprising:
   a main base plate having at least one edge and having a first main surface, and further having a circuit pattern on at least said first main surface and having circuit components electrically connected to said circuit pattern;
   a shield casing receiving said main base plate, said shield casing being open at one side adjacent to said edge of said main base plate;
   an auxiliary base plate secured to said shield casing across said open side of said shield casing, said auxiliary base plate having an outer main surface and having a conductive shield layer on substantially the whole of said outer main surface; said main base plate having therein a first aperture, and said auxiliary base plate having therein a second aperture;
   a capacitor element received in said second aperture and having an additional aperture therein; and
   a connection terminal having two arms oriented relative to each other at substantially a right angle, one arm being received in said first aperture and being electrically connected to said circuit pattern and mechanically secured to said main base plate, and the other arm being received in said additional aperture of said capacitor element and extending out through said auxiliary base plate and further being electrically connected to and mechanically secured to said capacitor element, whereby said other arm is secured in place through said aperture in said capacitor element and relative to said auxiliary base plate.

2. A high frequency apparatus in accordance with claim 1, wherein said connection terminal has an abutting portion abutting an end surface of said capacitor element for urging said capacitor element against said auxiliary base plate.

3. A high frequency apparatus in accordance with claim 1, wherein said main base plate has a second main surface and wherein said first aperture receives said one arm from the direction of said second main surface of said main base plate, and wherein said connection terminal and said circuit components are electrically connected and mechanically fixed to said circuit pattern through one dipping step.

4. A high frequency apparatus in accordance with claim 1, wherein said auxiliary base plate has a third aperture, and wherein said connection terminal has a protrusion received in said third aperture for maintaining said connection terminal in position relative to said auxiliary base plate.

5. A high frequency apparatus in accordance with claim 4, wherein said protrusion of said connection terminal has a second protrusion abutting against said auxiliary base plate near said third aperture.

6. A high frequency apparatus in accordance with claim 4, wherein the tip end of said protrusion of said connection terminal is configured to be pressure inserted into said third aperture.

7. A high frequency apparatus in accordance with claim 1, wherein said main base plate has therein a plurality of first apertures and said auxiliary base plate has therein a plurality of second apertures equal in number to said first apertures; and wherein a respective second conductive layer is located on said outer main surface of said auxiliary base plate near any of said second apertures that do not receive a capacitor element, said second conductive layers being electrically isolated from said conductive shield layer; and said apparatus further comprising a plurality of connection terminals having two arms oriented relative to each other at substantially a right angle, one arm of each connection terminal being received in a respective one of said first apertures and being electrically connected to said circuit pattern and the other arm of each of said connection terminals extending through a respective one of said second apertures; said other arm of at least one of said connection terminals being received in and extending through said additional aperture of said at least one capacitor element, and each one of said other arms that extends through one of said second apertures that are provided with said second conductive layers being electrically connected to said second conductive layer.

8. A high frequency apparatus in accordance with claim 7, wherein said high frequency apparatus is a tuner for a television receiver, and respective ones of said connection terminals are a power supply terminal, a television signal input terminal and a converted signal output terminal, said power supply terminal extending through said at least one capacitor element.

9. A high frequency apparatus in accordance with claim 7, wherein said auxiliary base plate has a plurality of third apertures equal in number to said second apertures, and wherein each of said connection terminals has a protrusion received in a corresponding one of said third apertures for maintaining said connection terminal in position relative to said auxiliary base plate.

10. A high frequency apparatus in accordance with claim 7 or claim 9, wherein said at least one said connection terminal whose said other arm extends through said additional aperture of said capacitor element has an abutting portion urging said capacitor element against said auxiliary base plate.

11. A high frequency apparatus in accordance with claim 9, wherein said protrusion of each of said connection terminals further comprises a second protrusion abutting against said auxiliary base plate near said third aperture.

12. A high frequency apparatus in accordance with claim 1 or claim 7, wherein said capacitor element is cylindrical.

13. A high frequency apparatus in accordance with claim 12, wherein said capacitor element has an electrode located on the interior surface of said aperture in said capacitor element, said other arm being in electrical and mechanical contact with said electrode.

14. A high frequency apparatus in accordance with claim 1, wherein said shield casing has at least one additional side open, said additional side being a side that is not adjacent an edge of said main base plate.

15. A high frequency apparatus in accordance with claim 14, further comprising a shield cover means covering and substantially closing said additional open side.

* * * * *